United States Patent [19]

Yoshino et al.

[11] Patent Number: 4,887,760
[45] Date of Patent: Dec. 19, 1989

[54] BONDING SHEET FOR ELECTRONIC COMPONENT AND METHOD OF BONDING ELECTRONIC COMPONENT USING THE SAME

[75] Inventors: Thunekazu Yoshino, Kamakura; Hiroshi Morita, Kawasaki; Hirotaka Nakano, Yokohama; Nobuo Hayashi, Miura; Yuko Kubota, Kamakura, all of Japan

[73] Assignee: Kabushiki Kaisha Toshiba, Kawasaki, Japan

[21] Appl. No.: 89,989

[22] Filed: Aug. 27, 1987

[30] Foreign Application Priority Data

Aug. 27, 1986 [JP] Japan .................................. 61-198915
Sep. 25, 1986 [JP] Japan .................................. 61-224763
Sep. 25, 1986 [JP] Japan .................................. 61-224766

[51] Int. Cl.$^4$ ...................... B23K 31/00; B23K 35/14; B23K 35/24
[52] U.S. Cl. ............................. 228/56.3; 228/180.2; 228/253; 228/263.11
[58] Field of Search ............ 228/120, 121, 122, 180.2, 228/158, 173.7, 263.11, 253, 56.3

[56] References Cited

U.S. PATENT DOCUMENTS

| 3,568,301 | 3/1971 | Shibata | 228/185 |
| 4,067,104 | 1/1978 | Tracy | 228/185 |
| 4,646,435 | 3/1987 | Grassauer | 228/180.2 |
| 4,705,205 | 11/1987 | Allen et al. | 228/180.2 |

FOREIGN PATENT DOCUMENTS

| 0171662 | of 1986 | European Pat. Off. | |
| 1919567 | of 1970 | Fed. Rep. of Germany. | |
| 2112466 | of 1972 | France. | |
| 0030448 | 3/1978 | Japan | 228/263.11 |
| 0134294 | 8/1982 | Japan | 228/263.11 |
| 1371738 | 10/1974 | United Kingdom. | |

OTHER PUBLICATIONS

IBM Technical Disclosure Bulletin, vol. 28, No. 3, Aug. 1985, pp. 1184–1185.
IBM Technical Disclosure Bulletin, vol. 27, No. 8, Jan. 1985, p. 4855.
IBM Technical Disclosure Bulletin, vol. 17, No. 2, Jul. 1974, p. 627.

*Primary Examiner*—Richard K. Seidel
*Assistant Examiner*—William Scott Andes
*Attorney, Agent, or Firm*—Cushman, Darby & Cushman

[57] ABSTRACT

The bonding sheet of the present invention comprises a substrate having an opening, and a low-melting point bonding metal which closes the opening or is arranged on the peripheral portion of the opening, to project in the opening. According to a bonding sheet of the present invention, a low-melting point bonding metal is interposed between a conductor pattern of a substrate and electrode terminals of an electronic component, and is bonded by thermocompression at a low temperature without melting the low-melting point bonding metal, so that bonding of a large number of electrode terminals can be completed by a single bonding operation.

23 Claims, 5 Drawing Sheets

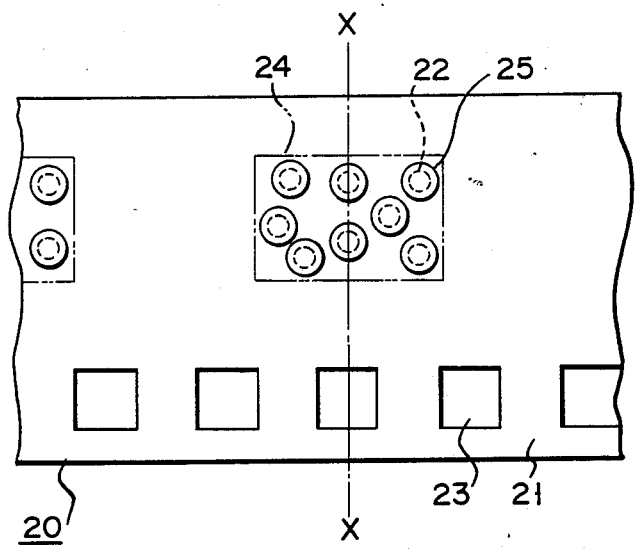
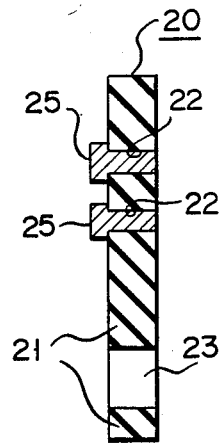
F I G. 1A   F I G. 1B
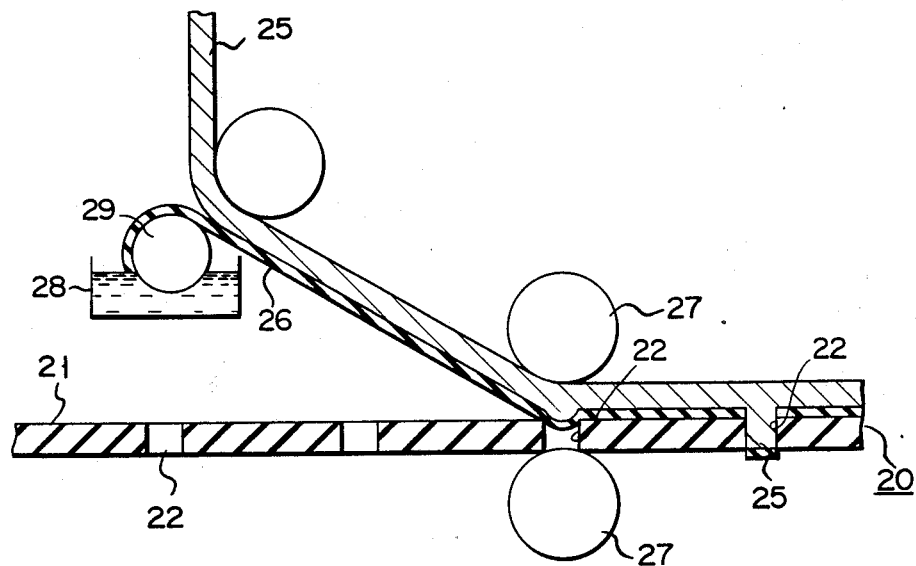
F I G. 2

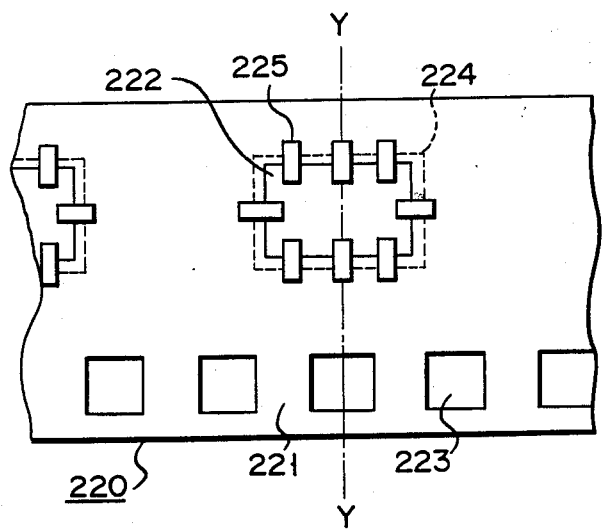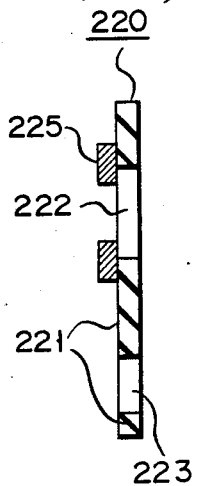
FIG. 6A  FIG. 6B
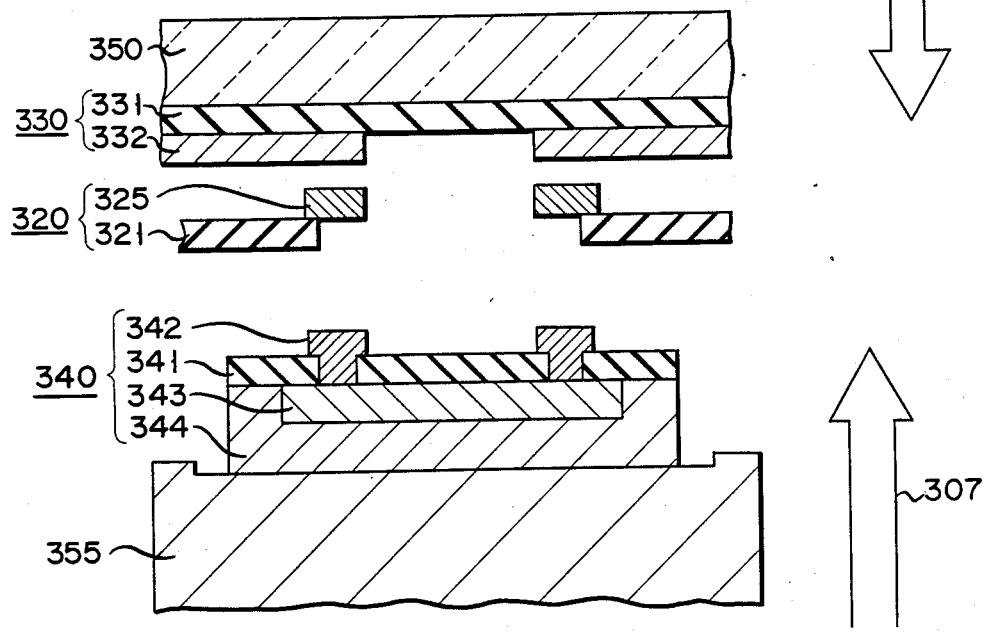
FIG. 7

BONDING SHEET FOR ELECTRONIC COMPONENT AND METHOD OF BONDING ELECTRONIC COMPONENT USING THE SAME

BACKGROUND OF THE INVENTION

1. Field of the Invention

The present invention relates to a bonding sheet for an electronic component, which is used when electrode terminals of the electronic component such as a semiconductor element are electrically connected to a conductive pattern formed on the substrate, and a method of bonding an electronic component, using the same.

In the course of recent technical developments, semiconductor integrated circuits have been miniaturized at a high density, some integrated circuit elements having 100 terminals or more. Consequently, a demand has arisen for the development of techniques for efficiently bonding the high-density integrated circuit element onto a substrate with conductive patterns. Among the techniques developed, a flip-chip method, in particular, which can simultaneously bond a large number of electrode terminals of a semiconductor integrated circuit to conductive patterns of a substrate, has received a great deal of attention.

The flip-chip method is a general term for face-down bonding wherein a semiconductor element is bonded to bonding pattern terminals formed on a substrate, while its active surface faces downward. This method can be mainly classified into a method wherein bonding is performed after metal projections (bumps) are formed on electrode terminals on a semiconductor element and a method wherein bonding is performed after bumps are formed on connecting terminals on a substrate with conductive patterns.

In order to form bumps, in a known method of the former one, a multilayered structure of Cr/Cu/Au or Ti/Ni/Au is formed by deposition, after which a Pb-Sn solder is plated thereover. In a known method of the latter one, a Pb-Sn solder is printed or plated. In either method, formation of bumps requires complicated processes, resulting in a low yield.

Using the flip-chip method, electrode terminals of the semiconductor element are bonded to connecting terminals on the substrate with conductive patterns, at a high temperature of 250° to 330° C. However, a solder used for the connecting terminals causes peeling, cracking, and the like, due to temperature distortion (arising from the difference in the termal expansion coefficient of the semiconductor element and that of the wiring substrate) when the solder is cooled from the high temperature upon melting and bonding to room temperature, resulting in poor reliability. Such a high temperature also degrades a device formed on the substrate. When a liquid crystal display is used for a substrate, an organic color filter is degraded. Since the heat-resistance temperature of a color filter is about 150° C., its characteristics become degraded at the above-mentioned temperature.

Another known method of bonding the electrode terminals of a semiconductor element and connecting the terminals of a substrate or the like is the film carrier method. Using this method, a conductive layer on a resin film is bonded to electrode terminals on a semiconductor element by means of thermocompression bonding. More specifically, a bump formed of, for example, a Ti/Ni/Pd/Au laminated structure is formed on Al electrode terminals on a semiconductor element, and Sn is deposited on a Cu conductive layer on a film carrier. Heat at a temperature of 450° to 500° C. and a high pressure of 200 to 1000 kg/cm$^2$ (20 to 100 g per 100 $\mu$m $\times$ 100 $\mu$m terminal) are applied to both the bump and carrier, so that they are bonded by a gold-tin eutectic. However, as in the case of the flip-chip method, so also in the case of the film carrier method, temperature distortion occurs due to the high temperature. Also, since the above high pressure is applied to the semiconductor element, the element may be damaged.

Further, it is difficult to form electrode terminals having a uniform height due to an increase in the number of electrode terminals as described above. Therefore, a high pressure is locally generated between the bump and the connecting terminal (or electrode terminal), and the semiconductor element may be damaged.

SUMMARY OF THE INVENTION

It is an object of the present invention to provide a bonding sheet for an electronic component capable of bonding at a low pressure and at a low temperature, and a method of bonding an electronic component using the same.

The bonding sheet of the present invention comprises a substrate having an opening, and a low-melting point bonding metal which closes the opening or is arranged on the peripheral portion of the opening, to project in the opening. The bonding method of the present invention comprises the following steps:

a first step of arranging, between electrode terminals of an electronic component and a substrate having a conductor pattern to be electrically connected to the terminals, a bonding sheet for the electronic component, comprising a substrate having an opening, and a low-melting point bonding metal which closes the opening or is arranged on the peripheral portion of the opening to project in the opening; and a second step of bonding the electrode terminals and the conductor pattern through the low-melting point bonding metal.

BRIEF DESCRIPTION OF THE DRAWINGS

FIGS. 1A and 1B are respectively a plan view and a sectional view of a bonding sheet according to Example 1 of the present invention;

FIG. 2 is a view showing the step of forming a bonding metal on a bonding sheet substrate;

FIGS. 6A and 6B are respectively a plan view and a sectional view of a bonding sheet according to Example 3 of the present invention;

FIG. 7 is a sectional view of a bonding sheet according to Example 4 of the present invention.

DETAILED DESCRIPTION OF THE INVENTION

Figure 3:
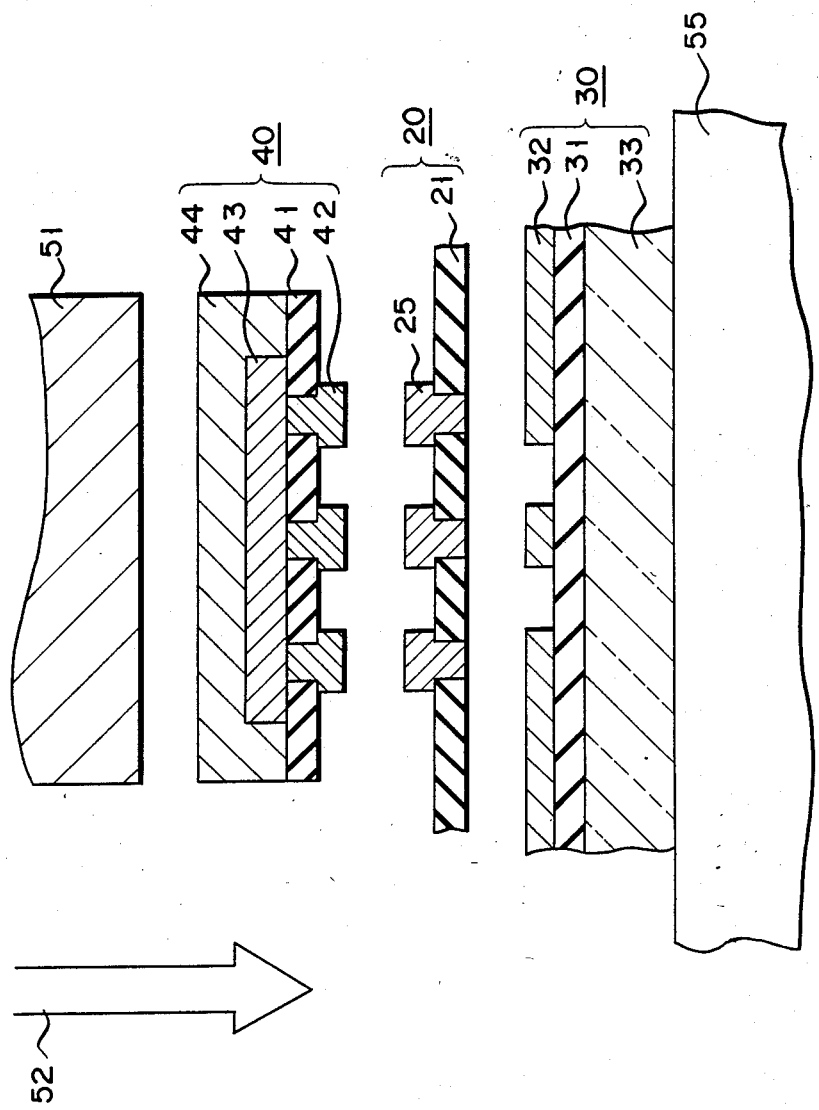
FIG. 3 is a view for explaining a bonding method using the bonding sheet.

According to a bonding sheet of the present invention, a low-melting point bonding metal is interposed between a conductor pattern of a substrate and electrode terminals of an electronic component, and is bonded by thermocompression at a low temperature without melting the low-melting point bonding metal, so that bonding of a large number of electrode terminals can be completed by a single bonding operation. With the bonding method of the present invention, since no bump must be formed on a semiconductor integrated circuit element, defects on the integrated circuit element caused by bump formation cannot occur.

The thickness of the sheet used in the present invention preferably falls within the range of 50 to 150 μm, and more preferably, falls within the range of 100 to 130 μm in consideration of a mechanical strength (resistance against torsion, flexure and the like). The shape of the opening can only be suitable for that of an electrode terminal of a semiconductor element, and a circular shape having a diameter of 100 to 200 μm is preferable. A plurality of openings are normally formed at predetermined intervals in correspondence with a plurality electrode of the semiconductor element.

When a low-melting point bonding metal is formed to close the opening or to project in the opening, the bonding metal is adhered to a substrate with an adhesive, and thereafter, is etched to have a predetermined pattern. A bonding temperature preferably falls within the range of 150° to 155° C. if the melting point of the bonding metal is 160° C., and a bonding pressure preferably falls within the range of 50 to 100 kg/cm$^2$. Note that the thickness of the bonding metal preferably falls within the range of 0.2 to 0.5 mm.

The low-melting point bonding metal can be one capable of thermocompression bonding, and in particular, a low-melting point adherent alloy is preferable. Basically, the low-melting point adherent alloy is prepared such that an element for improving a bonding property of an interface is added to a low-melting point solder alloy. The low-melting point solder alloy is prepared such that In, Bi, Cd or the like, in particular, In, for achieving a low melting point is added to a solder of at least two elements selected from the group consisting of Pb, Sn, Zn, Cd, and Bi, e.g., Pb-Sn or Sn-Zn.

An example of an element for improving a bonding property at an interface between a low-melting point adherent alloy and an electrode terminal of a semiconductor element and a terminal of a conductive pattern on the substrate is Sb. If Zn, Al, Ti, Si, Cr, Be, or an element such as a rare-earth element having strong affinity with oxygen is further added, a bonding strength can be improved. Unless a thermocompression bonding property as a basic characteristic is greatly changed, the low-melting point adherent alloy may contain another impurity (any element). When an ultrasonic vibration is applied to the low-melting point adherent alloy during a bonding step, the alloy can be strongly bonded to glass. By thermocompression bonding in a semi-molten state, the alloy can be strongly bonded to glass, other oxides, or metals such as Mo, Cr, and Ta which cannot be easily bonded to the Pb-Sn solder. Therefore, the alloy can be easily bonded to metal oxides such as SnO$_2$, In$_2$O$_3$, and ITO (Indium Tin Oxide) known as a transparent electrode material. A bonding mechanism of the adherent alloy can be explained by chemical bond of (Alloy)-(Additive)-O-(Oxide).

Electrode terminals of a semiconductor element are conventionally formed of aluminum. Since the surface of the aluminum electrode terminal is naturally oxidized and an Al$_2$O$_3$ film is formed thereon, this mainly causes a degradation in bonding properties. However, since the bonding sheet of the present invention has strong affinity with oxygen, the bonding properties will not be degraded even if the Al$_2$O$_3$ film is formed on the electrode terminals. For this reason, the surface of the Al electrode terminal need not be subjected to special surface treatment (deposition of bonding metal, or the like), and the manufacturing processes can be simplified.

Pb, Sn, Zn, Sb and the like constituting an alloy can be appropriately selected, so that an alloy having a softening temperature of 165° C. and a melting temperature of about 195° C. can be easily obtained. In this invention, bonding by plastic deformation of a low-melting point bonding metal in a semi-molten state is utilized. If this metal is heated to a temperature higher than its melting point, it may be flowed to short-circuit adjacent electrode terminals. Therefore, careful temperature control is required.

According to the present invention, since the bonding metal is in a semi-molten state upon bonding, plastic deformation can be caused at a low pressure. Therefore, the semiconductor element will not be damaged. Since the bonding metal is set in the semi-molten state at low temperature, a temperature difference is small if the metal is cooled to a room temperature, and cracking and the like cannot occur. Therefore, the bonding metal of the present invention is suitable for bonding a driving semiconductor integrated circuit element onto a device unsuitable for high-temperature treatment, e.g., a liquid crystal display having an organic color filter. When an electrode substrate of a liquid crystal display is used as a substrate, transparent display electrodes of SnO$_2$, In$_2$O$_3$, or ITO serve as connecting terminals.

Even if distances between a large number of electrodes and connecting terminals are not uniform, since the bonding metal is bonded in the semi-molten state, it can be bonded without causing any problem.

DETAILED DESCRIPTION OF THE PREFERRED EMBODIMENTS

Example 1

FIG. 1A is a plan view of bonding sheet 20 according to the present invention, and FIG. 1B is a sectional view taken along a line X—X in FIG. 1A.

A predetermined number of through holes 22 are formed at positions corresponding to electrode terminals of a semiconductor element (the outer shape of the element is indicated by broken line 24) in elongated transparent tape 21 of a polyester resin using sprockets (holes for conveying the tape) 23 as positioning guides. Low-melting point metal 25 is filled in each through hole 22.

FIG. 2 illustrates the manufacture of bonding sheet 20. After sheet-like low-melting point bonding metal 25 is etched by hydrochloric acid-nitric acid mixture to obtain a cleaned surface, it is washed with water and dried (not shown). Then, heat-resistant adhesive 26, which is supplied from container onto a roller 29, is applied to metal 25. Thereafter, tape 21 with through holes 22 and low-melting point bonding metal 25 are adhered to each other through adhesive 26 by rollers 27. In this case, when a pressure is applied to tape 21 and metal 25 by rollers 27 while heating them at a temperature slightly lower than the melting point of metal 25, metal 25 can be filled in through holes 22. Metal 25 on tape 21 is removed by photoetching to leave it around the peripheral portion of each through hole 22 in a square or circular shape (see FIG. 1B). For example, a low-melting point bonding metal containing Pb-Sn-In as a major constituent can be easily etched by hydrochloric acid or the like. Note that since the low-melting point bonding metal has a larger thickness than a normal object to be etched, the metal is not dipped in an etching solution, but the etching solution is sprayed in a direction of thickness of the metal so that undercutting can be prevented. Finally, exposed adhesive 26 and a resist left on metal 25 are removed, thus obtaining a bonding sheet of the present invention.

In Example 1, a low-melting point adherent alloy containing 20% by weight of Pb, 66% by weight of Sn, 10% by weight of In, and 2% by weight of Sb, and 2% by weight of Zn was used. Since this alloy had a softening point of 134° C. and a melting point of 160° C., thermocompression bonding can be performed at a temperature of 150° C.

A bonding method using bonding sheet 20 will now be described. Referring to FIG. 3, in semiconductor integrated circuit element 40, a plurality of Al electrode terminals 42 are formed on oxide film 41 as an insulating layer covering functional circuit portion 43 formed on a portion of the surface of substrate 44. In wiring substrate 30, connecting terminals 32 formed integrally with a conductor pattern on an insulating layer 31 formed on glass substrate 33 are formed in correspondence with electrode terminals 42 of semiconductor element 40.

Upon bonding, substrate 30 is placed on heat block 55, and bonding sheet 20 is arranged between semiconductor integrated circuit element 40 and substrate 30. After electrode terminals 42 of element 40 and metal pieces 25 of sheet 20 are aligned with connecting terminals 32, thermocompression bonding is performed in the direction indicated by arrow 52 by tool 51 incorporating a heater (not shown). In this case, one bonding sheet 20 may be used for each semiconductor element 40. However, when a plurality of semiconductor elements (40) are bonded to substrate 30, one sheet 20 can be used for bonding a plurality of semiconductor elements (40) if connecting terminal patterns on substrate 30 for bonding with a plurality of semiconductor elements are matched with through holes 22 of bonding sheet 20.

Figure 4A:
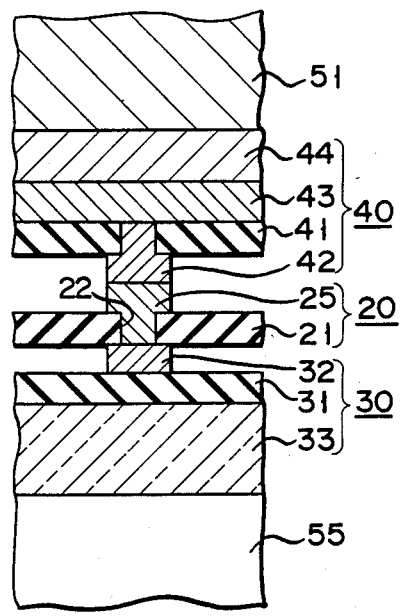
FIGS. 4A and 4B are views for explaining a compression mechanism in the method shown in FIG. 3.

The thermocompression bonding is performed as shown in FIG. 4A. Electrode terminal 42 of element 40 is pressed by tool 51 against connecting terminal 32 through low-melting point bonding metal piece 25 in the through hole at a pressure of 1 to 10 g per electrode terminal which is 100 $\mu m \times 100$ $\mu m$.

Substrate 30 on which connecting terminals 32 are formed is fixed to heat block 55, and a temperature bias of 100° to 120° C. is applied in advance to the substrate. When the heater incorporated in tool 51 is driven, metal piece 25 can be heated to 145° to 150° C., i.e., above a softening point and below a melting point, within several seconds (using a pulse heat method for ease of operation). After the predetermined temperature is reached, heating by the heater is stopped, and the structure is cooled below a softening point temperature of 134° C. while being compressed. Finally, tool 51 is removed.

Figure 4B:
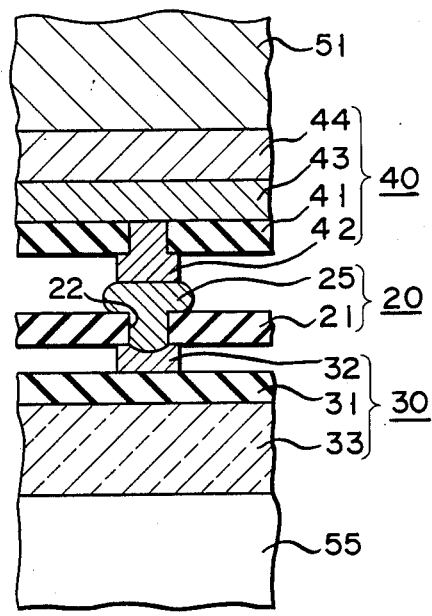

FIG. 4B shows a state wherein low-melting point bonding metal piece 25 is plastically deformed and extends via through hole 22 in bonding sheet 20, and connecting terminal 32 of substrate 30 and electrode terminal 42 on semiconductor element 40 are electrically bonded to each other through metal piece 25.

Thereafter, an unnecessary portion of the bonding sheet can be removed, and thus, the bonding operation can be completed. The bonded portion can be protected by a potting agent, thus further improving reliability.

Example 2

Figure 5:
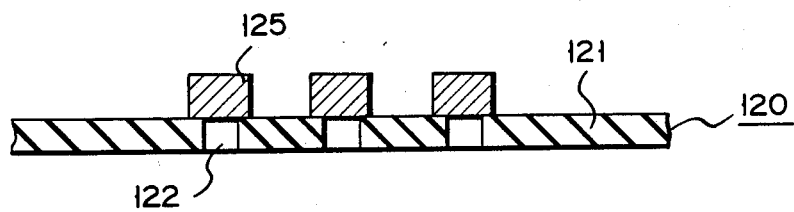
FIG. 5 is a sectional view of a bonding sheet according to Example 2 of the present invention.

Referring to FIG. 5, low-melting point bonding metal pieces 125 close corresponding through holes 122 and are formed on polyester resin tape 121 to cover through hole 122 without being filled therein. In a bonding method using bonding sheet 120, each low-melting point bonding metal piece 125 is filled in corresponding through hole 122 upon heating and compression of the bonding operation, and the electrode terminals of a semiconductor integrated circuit element and connecting terminals of a substrate are electrically connected to each other through corresponding metal pieces 125.

Example 3

Referring to FIGS. 6A and 6B (sectional view taken along a line Y—Y in FIG. 6A), through hole 222 of bonding sheet 220 is not closed by a low-melting point bonding metal, but low-melting point bonding metal pieces 225 extending in through hole 222 are arranged around each through hole 222.

In polyester resin tape 221, each through hole 222 is formed into a square shape using sprockets 223 as positioning guide in correspondence with a size of a semiconductor element (the outer shape of the element is indicated by broken line 224). The size of through hole 222 is preferably slightly smaller than the outer shape of the semiconductor element since short-circuiting of the surrounding portion can be advantageously prevented although the thickness of tape 221 slightly disturbs bonding. A low-melting point bonding metal foil (Pb-Sn-Zn alloy foils containing Sb are adhered) on tape 221 is etched by photoetching to leave portions corresponding to the electrode terminals of a semiconductor element around through hole 222, thus forming metal pieces 225.

Bonding sheet 220 is arranged between a substrate and a semiconductor integrated circuit element in the same manner as described above, and after the electrode terminals on the semiconductor element, the low-melting point bonding metal foil pieces of the bonding sheet, and the connecting terminals of the substrate are aligned, they are thermocompression-bonded by the tool.

Example 4

Referring to FIG. 7, in substrate 330, conductive pattern 332 is formed on a flexible substrate 331. A plurality of Al electrode terminals 342 are formed on oxide film 341 as an insulating layer covering functional circuit portions 343 formed on a portion of the surface of substrate 344. Conductive pattern 332, electrode terminal 342, and low-melting point bonding metal pieces 325 projecting from polyester resin tape 321 of bonding sheet 320 are aligned while being observed on the side of glass plate 350 from the direction indicated by arrow 352, and are compressed by tool 372 in the direction indicated by arrow 307. In Example 4, no beat block is necessary upon bonding, and semiconductor element 340 is heated by tool 355 supporting element 340.

In the above examples, the cases have been exemplified wherein bonding is performed in air. However, bonding may be performed in an inert gas atmosphere.

This method is effective for preventing oxidation of a micropattern.

Indicated below in Table are contact resistance values between the bonding metal described in Example 1 and various typical materials.

TABLE

| Material | Resistance ($\Omega \cdot cm^2$) |
|---|---|
| ITO | $10^{-3} - 10^{-4}$ |
| Al | $10^{-5} - 10^{-6}$ |
| Au | $- 10^{-6}$ |
| Sn | $10^{-6} - 10^{-7}$ |

As indicated in Table above, a practical bonding can also be attained in terms of electrical resistance by using the bonding sheet of the present invention.

In particular, when the bonding metal used in the invention is bonded with Au or Sn, an intermetallic bonding can be obtained, resulting in an ideal electrical connection. Thus, when Sn or Au is formed on Al electrode terminals on a semiconductor element, a lower resistance and higher reliability can be obtained. In this case, Au or Sn may be formed to a thickness of only about 500 to 5000 Å, and its formation is easier than bump formation.

Figure 8:
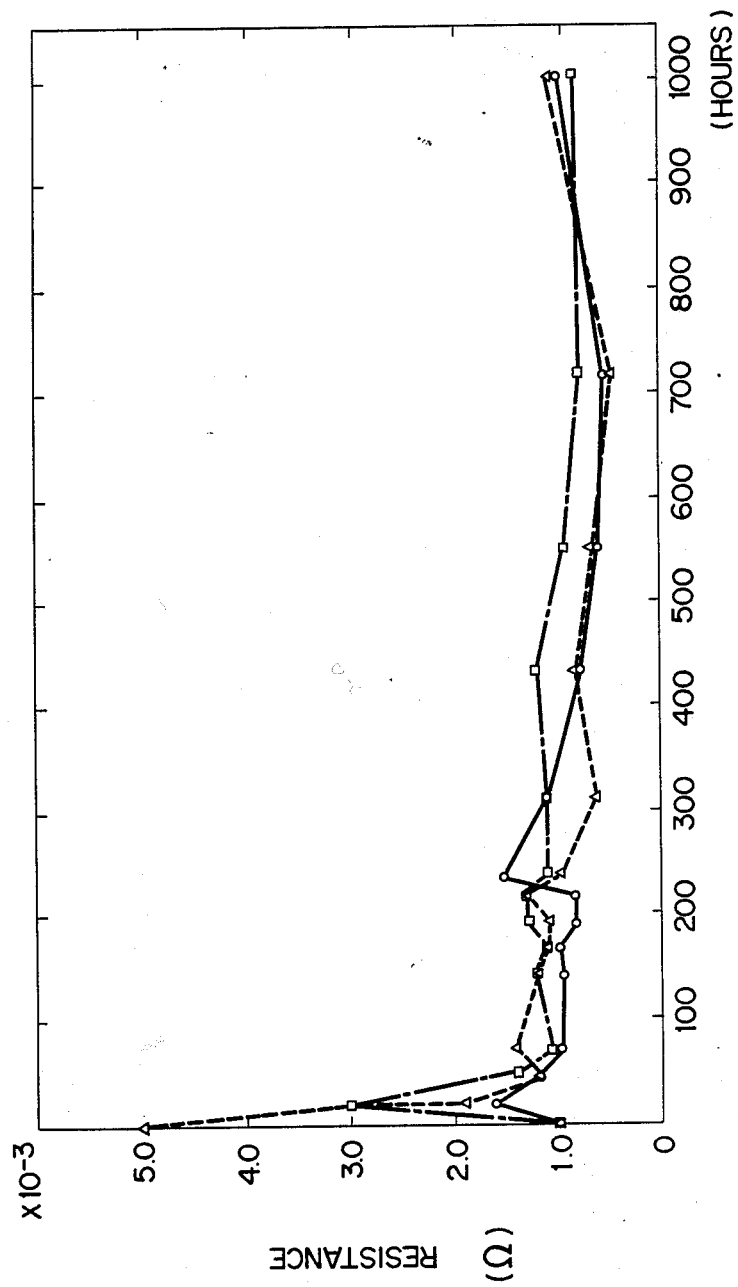
FIG. 8 is a graph showing characteristics of bonding according to the present invention.

Incidentally, three samples were prepared by bonding the bonding metal of Example 1 having a thickness of 0.2 mm to a Sn substrate. The bonded are in each sample was 1 mm². The samples were tested for their lifetime on reliability under accelerated conditions at temperature of 80° C. and a humidity of 95%. The results are shown in FIG. 8.

What is claimed is:

1. A bonding sheet for an electronic component, comprising:
   a substrate having an opening, and
   a plurality of low-melting point bonding metal strips disposed at and projecting from a peripheral portion of said opening of said substrate, toward an inner portion of said opening but not completely closing said opening.

2. A sheet according to claim 1, wherein said low-melting point bonding metal strips comprise a low-melting point adherent alloy.

3. A sheet according to claim 2, wherein said low-melting point adherent alloy contains, as major constituents, a low-melting point solder alloy, and an element for improving bonding strength at an interface between said alloy and an electronic component to be bonded thereto.

4. A sheet according to claim 3, wherein said low-melting point solder alloy contains, as major constituents, In and two elements selected from the group consisting of Pb, Sn, Zn, Cd, and Bi.

5. A sheet according to claim 3, wherein said element for improving the bonding strength at the interface is Sb.

6. A sheet according to claim 2, wherein said low-melting point adherent alloy contains, as major components, a low-melting point solder alloy, an element for improving bonding strength at an interface between said alloy and an electronic component to be bonded thereto, and an element having a strong affinity with oxygen.

7. A sheet according to claim 6, wherein said low-melting point solder alloy contains, as major components, In and two elements selected from the group consisting of Pb, Sn, Zn, Cd, and Bi.

8. A sheet according to claim 6, wherein said element for improving the bonding strength at the interface is Sb.

9. A sheet according to claim 6, wherein said element having the strong affinity with oxygen is an element selected from the group consisting of Zn, Al, Ti, Si, Cr, Be, and rare-earth elements.

10. A sheet according to claim 2, wherein said low-melting point adherent alloy has a softening point of approximately 130° C. and a melting point of approximately 160° C.

11. A bonding sheet as in claim 1, wherein said substrate is not transparent.

12. A method of bonding an electronic component comprising:
   a first step of arranging, between electrode terminals of the electronic component and a conductor pattern to be electrically connected to said terminals, a bonding sheet for an electronic component, comprising a substrate having an opening, and a low-melting point bonding metal plurality of disposed at and projecting from a peripheral portion of said opening of said substrate, toward an inner portion of said opening but not completely closing said opening; and
   a second step of bonding said electrode terminals and said conductor pattern through said low-melting point bonding metal strips.

13. A method according to claim 12, wherein said conductor pattern comprises a transparent conductive film.

14. A method according to claim 13, wherein said transparent conductive film is of a material selected from the group consisting of $SnO_2$, $In_2O_3$, and ITO.

15. A method according to claim 12, wherein said electronic component is a semiconductor integrated circuit element.

16. A method according to claim 15, wherein said electrode terminals of said electronic component are formed of Al.

17. A method according to claim 15, wherein said electrode terminals of said electronic component comprise a multilayered structure of Al and Sn.

18. A method according to claim 15, wherein said electrode terminals of said electronic component comprise a multilayered structure of Al and Au.

19. A method according to claim 12, wherein said low-melting point adherent alloy has a softening point of approximately 130° C. and a melting point of approximately 160° C.

20. A method as in claim 12, wherein said substrate is not transparent, and comprising the further step of, before said second step, inspecting a proper alignment between said electrode pattern and said conductive pattern, by visually inspecting through said opening which is not completely closed.

21. A method as in claim 12, wherein said first step includes attaching said bonding metal strips to a surface of said substrate.

22. A method according to claim 21, wherein the second step includes the steps of heating said low-melting point bonding metal strips to a temperature below the melting point thereof, and thermocompression-bonding said electrode terminals and said conductor pattern to each other.

23. A method according to claim 22, wherein said low-melting point bonding metal strips are heated to a temperature ranging from its softening point to its melting point, and half-molten.

* * * * *